(12) United States Patent
Rossetti et al.

(10) Patent No.: US 6,420,963 B1
(45) Date of Patent: Jul. 16, 2002

(54) PLASTIC HOUSING INCLUDING A CONDUCTIVE LINER FOR USE WITH AN ELECTRONIC DEVICE

(75) Inventors: Paul R. Rossetti; Doyle N. Dowd, both of Lawrenceville, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/785,681

(22) Filed: Feb. 16, 2001

(51) Int. Cl.⁷ ............................................. H04M 11/04
(52) U.S. Cl. ................. 340/310.01; 361/818; 174/35 R; 174/35 GC
(58) Field of Search ............................ 340/310.01, 635, 340/646, 647, 659; 361/690, 715, 799, 818, 800, 801; 174/35 R, 35 GC, 51

(56) References Cited

U.S. PATENT DOCUMENTS

| | | | |
|---|---|---|---|
| 4,855,873 A | * 8/1989 | Bhargava et al. | ............ 361/818 |
| 4,871,583 A | 10/1989 | Monnier | |
| 5,334,897 A | 8/1994 | Ineson et al. | |
| 5,548,083 A | * 8/1996 | Yamamoto | ............. 174/35 GC |
| 5,652,410 A | * 7/1997 | Hobbs et al. | ............. 174/35 R |
| D409,612 S | 5/1999 | McCann | |
| 6,138,347 A | * 10/2000 | Persson et al. | ........... 174/35 R |
| 6,150,606 A | * 11/2000 | Matsumoto et al. | ...... 174/35 R |
| 6,161,011 A | 12/2000 | Loveless | |
| 6,218,610 B1 | * 4/2001 | Suzuki | ..................... 174/35 R |
| 6,271,464 B1 | * 8/2001 | Cunningham | ............. 174/35 R |

\* cited by examiner

Primary Examiner—John Tweel
(74) Attorney, Agent, or Firm—Hubert J. Barnhardt, III; Kenneth M. Massaroni; Shelley L. Couturier

(57) ABSTRACT

A plastic housing for enclosing electronic circuitry that includes connectors for receiving and transmitting RF signals and power. The connectors include a center conductor and a shield, whereby a conductive liner within the plastic housing is connected to the shield of each connector. The conductive liner is capable of passing a minimum of 15 amperes of current through ground and also shields the enclosed electronic circuitry from EMI and RFI. Additionally, the plastic housing is capable of withstanding a significant amount of heat that is internally generated by the enclosed electronic circuitry.

18 Claims, 6 Drawing Sheets

PLASTIC HOUSING INCLUDING A CONDUCTIVE LINER FOR USE WITH AN ELECTRONIC DEVICE

FIELD OF THE INVENTION

This invention relates generally to broadband communications systems, such as cable television systems, and the electronic devices used in such systems, and more specifically, to housings that enclose the electronic devices.

BACKGROUND OF THE INVENTION

A communication system 100, such as a two-way cable television system, is depicted in FIG. 1. The communication system 100 includes headend equipment 105 for generating forward signals that are transmitted in the forward, or downstream, direction along a communication medium, such as a fiber optic cable 110, to an optical node 115 that converts optical signals to radio frequency (RF) signals. The RF signals are further transmitted along another communication medium, such as coaxial cable 120, and are amplified, as necessary, by one or more distribution amplifiers 125 positioned along the communication medium. Taps 130 included in the cable television system 100 split off portions of the forward signals for provision to subscriber equipment 135, such as set top terminals, computers, and televisions.

The system 100 also has reverse transmission capability so that signals, such as data, video, or voice signals, generated by the subscriber equipment 130 can be provided in the reverse, or upstream, direction to the headend 105 for processing. The reverse signals travel through the taps 130 and any nodes 115 and other cable television equipment, e.g., reverse amplifiers, to the headend 105. In the configuration shown in FIG. 1, RF signals generated by the subscriber equipment 135 travel to the node 115, which converts the RF signals to optical signals for transmission over the fiber optic cable 110 to the headend 105.

It is known that electronic devices, such as an amplifier or optical node, generate a significant amount of heat during operation. As a result, much time is taken in the design of the electronic devices to compensate for the heat generation. One example is the design of the housings that enclose the electronic devices. Conventional housings include such features as a substantial amount of metal, for example, aluminum, and fins that are formed into the metal housing to radiate the heat outward away from the internal electronics. Consequently, in addition to the housing being very costly, the weight due to the amount of metal causes stress and wind shears on the coaxial cable, since the amplifiers are typically mounted on coaxial cable and cable strands between poles. Cost and weight are two factors used by the operators when designing a cable television system, and if either one is too high, adjustments within the design need to be made.

A radio frequency (RF) cable amplifier housing is shown in FIG. 2 and is also shown in U.S. Pat. No. Des. 409,612, the teachings of which are incorporated herein by reference. Metal housings have been used since the conception of cable television electronic equipment due to the significant heat that is generated from the internal electronic devices. Conventional plastics used in housings for other electronic devices, such as cellular telephones, and even metal housings without fins, have not been able to withstand the heat generation from the internal components of the devices used in the cable television industry. There are, however, many disadvantages to the metal housing. The costs associated with casting the housings are high due the amount of metal that is used. Fins, which are added to the housing to increase the heat dissipation, greatly increase the material and manufacturing costs. Additionally, if harsh environmental conditions require added protection, such as an epoxy coating or a powder coating, the costs are increased even more.

In some applications, the housings exposed to harsh environments, such as salt, sand, and wind, may adversely affect the housing and, potentially, the electronic device within the housing. A typical application for an electronic device within the cable television system 100 is mounting the housing that encloses the electronic device on aerial cable 120. Some of the aerial cable 120 may be located directly along beachfront property. The combination of salt, sand, water, and wind may decrease the life of the housing. An epoxy coating is sometimes used to cover the housing to enhance the corrosion resistant properties; however, when the housing is exposed to harsh elements for a period of time, the coating may begin to pit and the metal may corrode. Additionally, the hardware, such as bolts and springs, used that closes the housing may freeze within the sockets, thereby not allowing the housing to open without breaking the hardware. Also, if the housing corrodes around a carbon-based, rubber gasket that encircles the inside of the housing for weatherproofing, there is risk of damage to the gasket and the internal electronics.

In summary, the housing for an electronic device has conventionally been made from metal, which results in a very heavy and costly housing. Epoxy or powder coatings that are sometimes used to cover the housing and allow it to withstand harsher weather conditions and enhance the heat dissipation, also dramatically increase the cost of the housing. Thus, what is needed is a low-cost housing that withstands severe environments without corrosion while dissipating the heat that is generated within the housing.

DETAILED DESCRIPTION OF A PREFERRED EMBODIMENT

Figure 3:
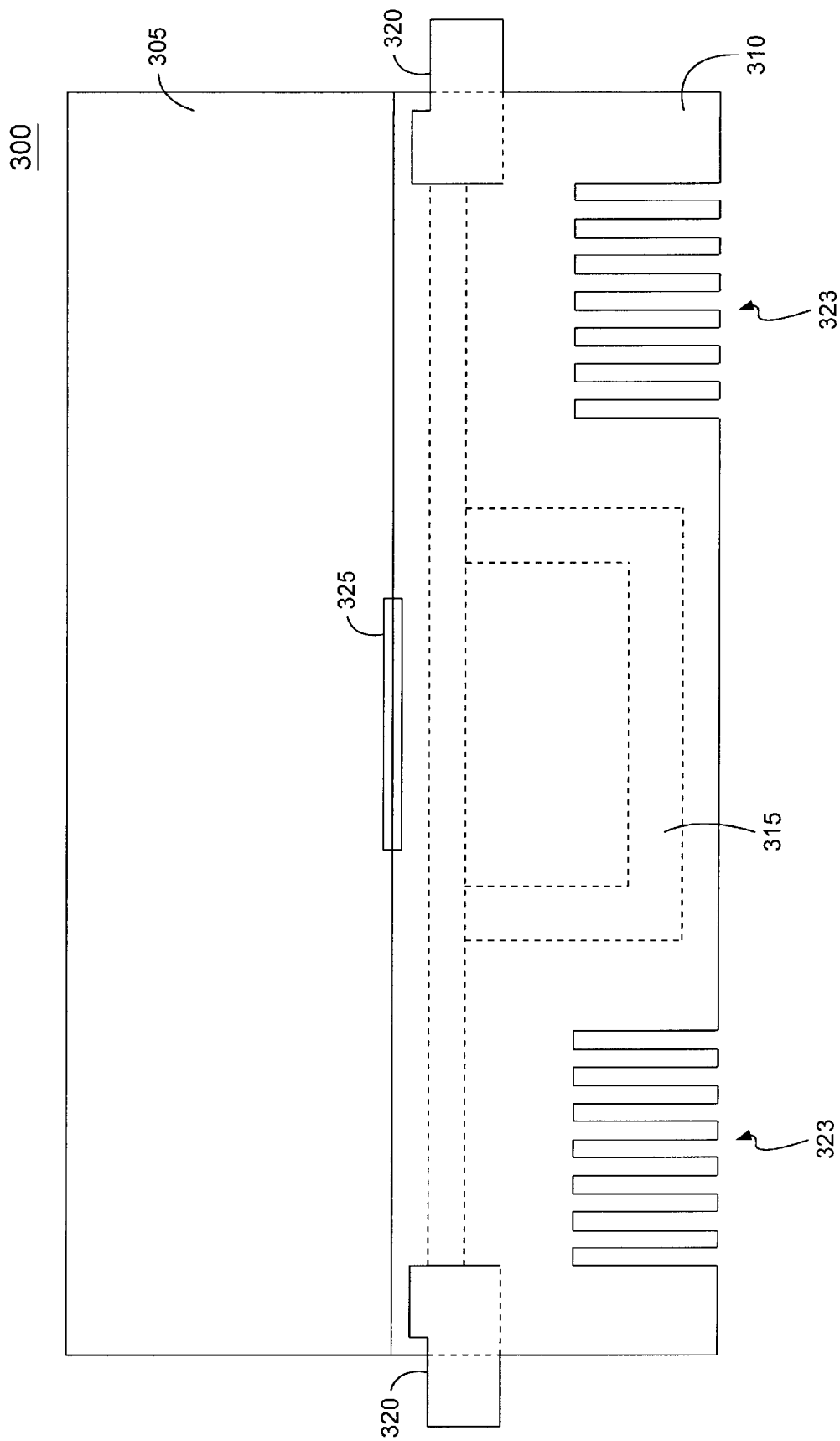
FIG. 3 shows a front view of a plastic housing for an electronic device in accordance with the present invention.

In accordance with the present invention, FIG. 3 illustrates a front view of a plastic housing 300 that includes a conductive metal liner 315 that can be used in a broadband communications system, such as a cable television system. U.S. Pat. No. 6,161,011 to Loveless, the teachings of which are incorporated herein by reference, shows a hybrid fiber coax communications system that could be used to implement an RF amplifier housed within the plastic housing 300 of the present invention.

Figure 1:
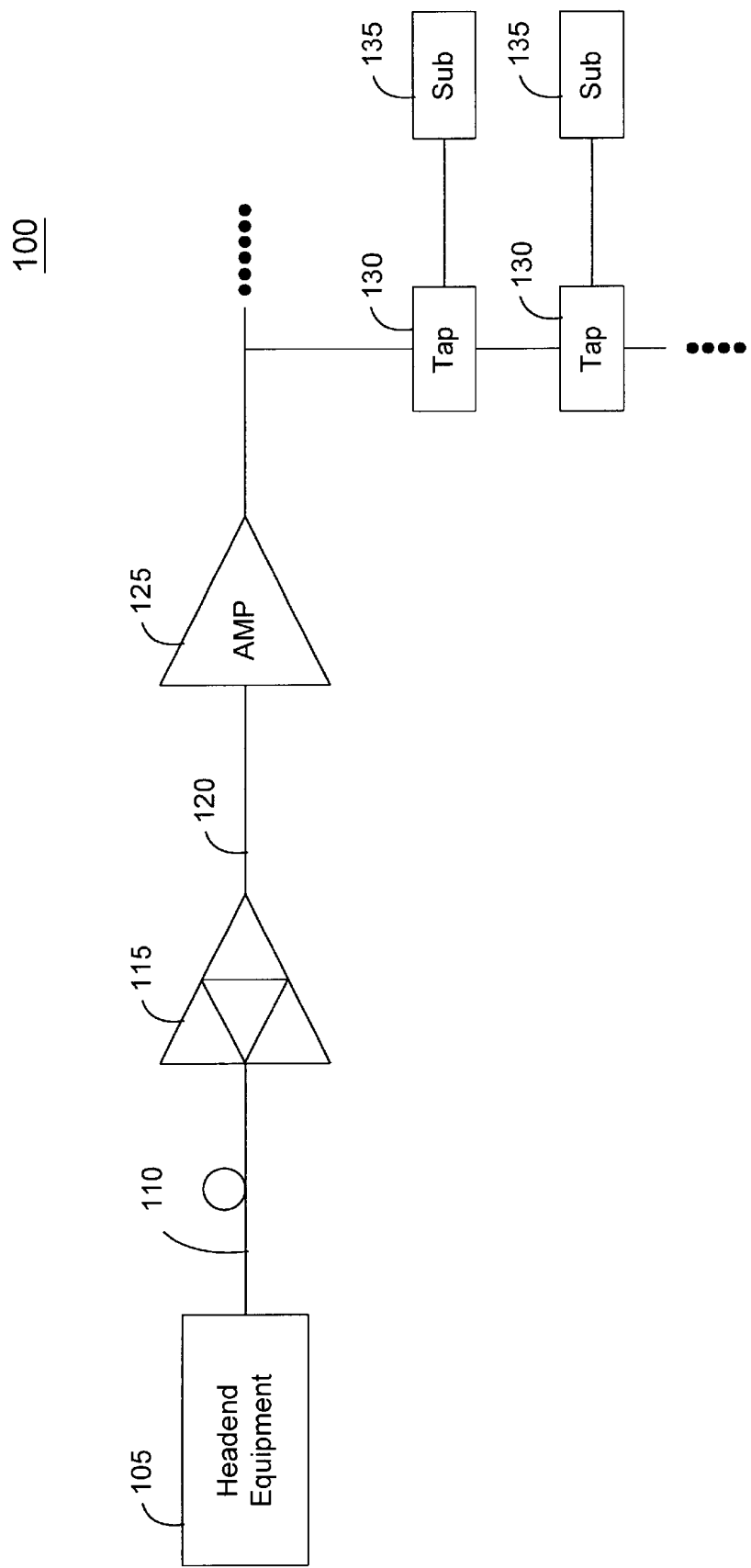
FIG. 1 depicts a communications system, such as a cable television system.
Figure 2:
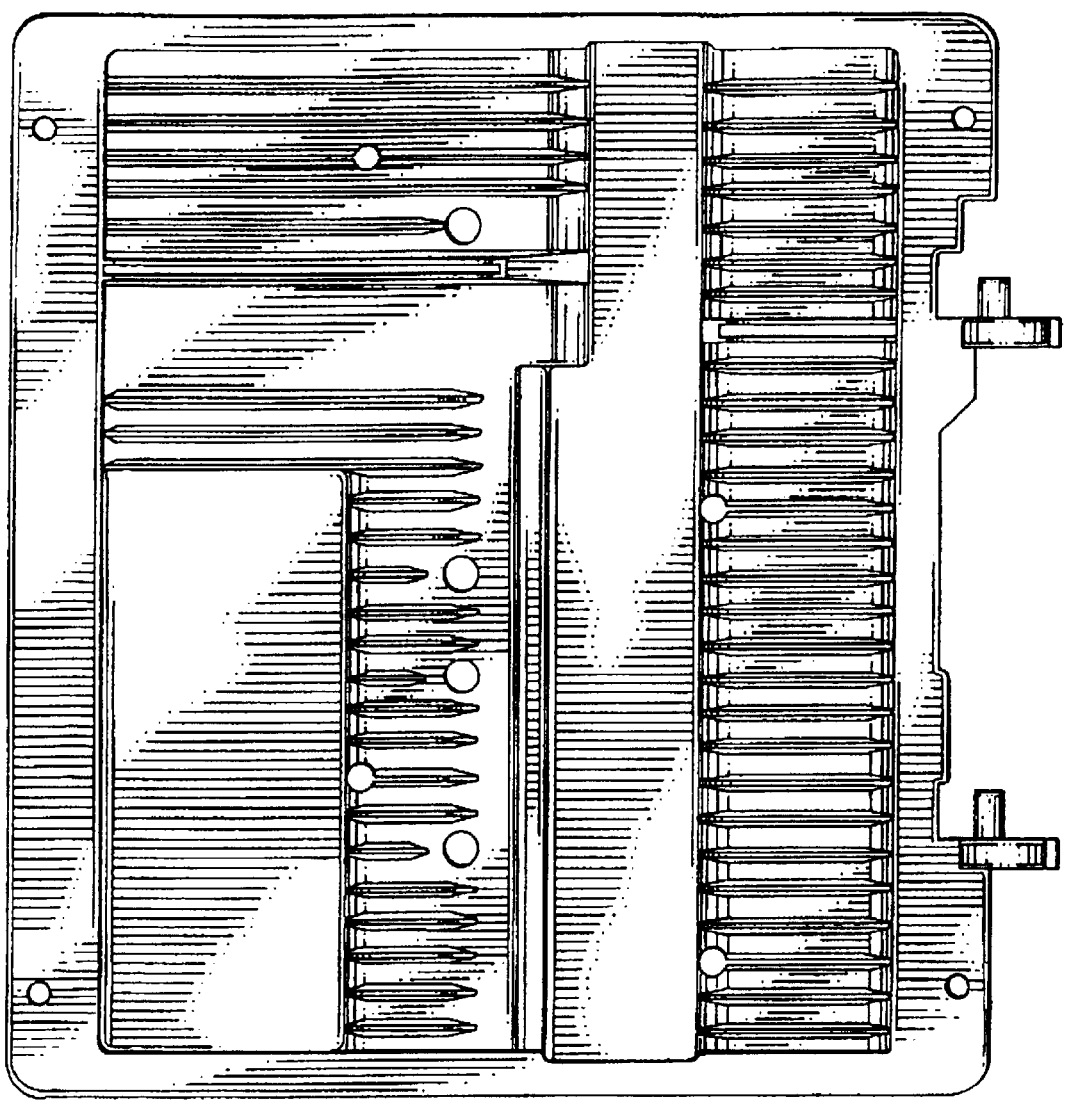
FIG. 2 shows a top view of a conventional housing used in the systems of FIG. 1.

It will be appreciated that the plastic housing 300 is drawn to resemble the conventional metal housing of FIG. 2 for discussion purposes; however, the plastic housing 300 can be formed into different appearances. As shown, a lid 305, a bottom 310, and a conductive liner 315 having input and output ports 320 are included in the plastic housing 300. The plastic housing 300 meets all the specifications, such as heat dissipation, electromagnetic interference (EMI) and radio frequency interference (RFI) shielding, and weather sealing, as the conventional metal housing of FIG. 2. In contrast, however, the plastic housing 300 weighs substantially less, has increased corrosion resistant properties, and costs less when compared to the conventional metal housing.

The plastic housing 300 is made from a high temperature plastic material, such as General Electric Lexan EXL9330 having a temperature rating of 80 degrees to 100 degrees. Celcius. The high temperature plastic withstands the temperatures that the internal electronics generate. For example, the internal electronics in a conventional RF amplifier generate temperatures in excess of 60 degrees Celcius within the housing 300 and the plastic is required to withstand temperatures to this degree; however, the plastic is allowed some degree of tolerance because the generated heat is redistributed by the conductive liner 315 in accordance with the present invention and is discussed below. If additional techniques are required to further dissipate the generated heat, metal fins 323 can be added to the outside of the housing 300. An example is to use two sets of metal fins 323 that include six rows of metal that are spaced about ½ inch apart and are about 4 inches in length. They can be placed in positions relative to internal components that generate the hottest temperatures within the housing 300, such as integrated circuits that amplify the RF signal within an RF amplifier. The fins 323 are then molded within the plastic to secure them in position. The fins themselves can also be coated to avoid corrosion of the metal.

Figure 4:
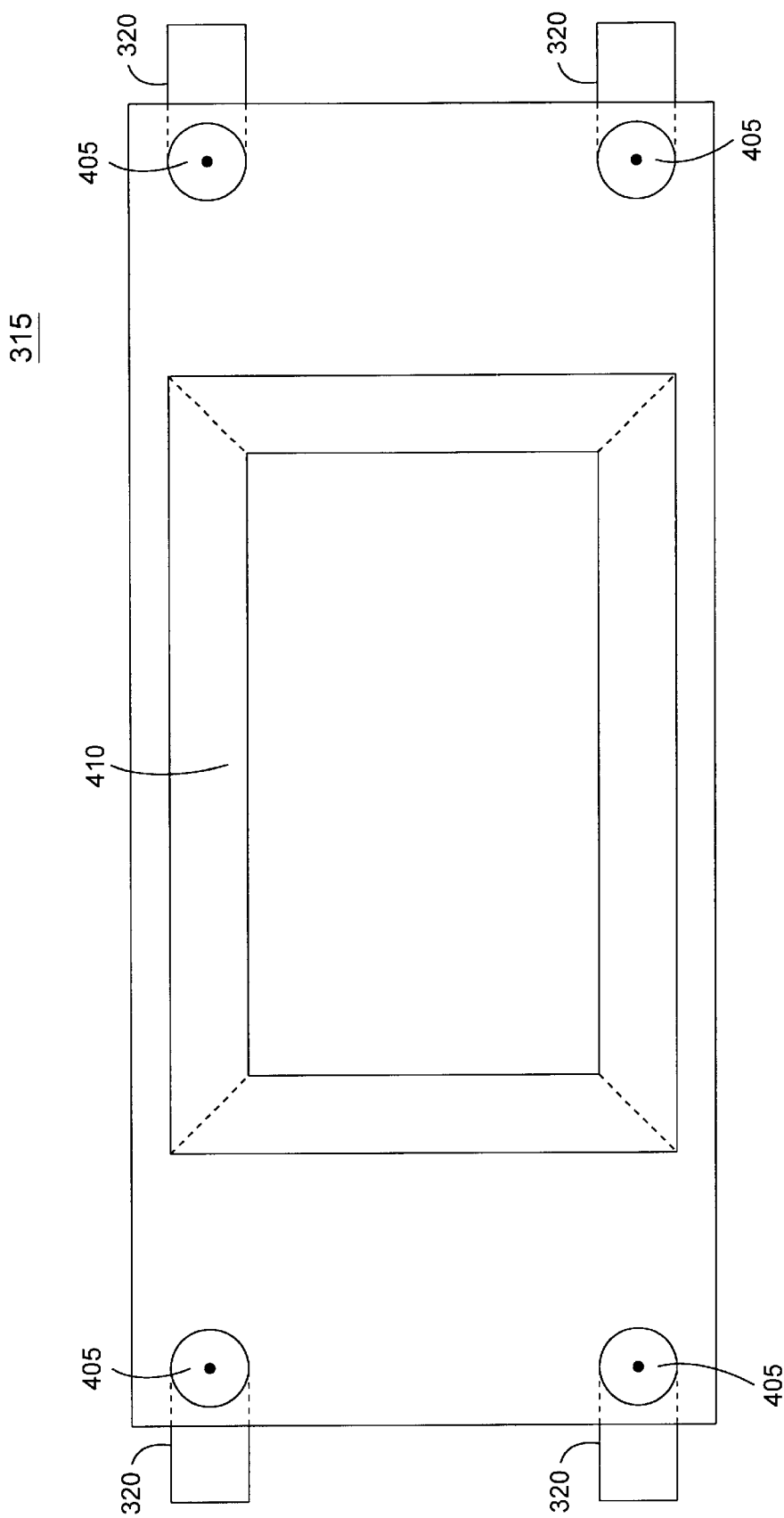
FIG. 4 shows a conductive liner used in the plastic housing of FIG. 3 in accordance with the present invention.

The conductive liner 315 is molded into the plastic of the housing bottom 310. A top view of the conductive liner is shown in FIG. 4. Briefly, the conductive liner 315 allows electrical current to flow through the electronic device within the plastic housing 300, provides a thermally conductive medium for heat dissipation, properly shields the internal electronic circuitry from EMI and RFI, and also provides for a ground plane for passing the current through ground and grounding the internal electronic circuitry.

Since the plastic is replacing the metal of a conventional housing (FIG. 2), there still needs to be a means of passing current through the electronic device. The conductive liner 315 in the present invention, which is made from a conductive metal, such as aluminum, is the means by which the electric current is passed. The maximum recommended current flow through a typical RF amplifier is 15 amps (A) of pseudo squarewave ferro resonant alternating current and a surge current of 25 A for a period of two hours. This specification is met with the conductive liner 315 having a length and thickness to accomplish these specifications. One example is to stamp a conductive liner 315 having the following specifications:

Length: 16¾ inches
Thickness: 0.05 inches
Material Grade: Die Cast Aluminum

Also as discussed, there are specific areas within the electronic device that generate significant heat while other areas remain much cooler depending upon the components used and their positions on the printed circuit board. In addition to meeting the required temperature rating of an elevated ambient temperature of 60 degrees Celcius, the conductive liner 315 inherently facilitates the redistribution of the generated heat that may gather around one particular area within the housing and dissipates that heat throughout the amplifier, thereby aiding in lowering the maximum temperature that the plastic housing 300 needs to withstand.

Additionally, the redistribution of heat may prolong the life of some heat sensitive components, such as an integrated circuit, within the electronic device.

Additionally, the conductive liner 315 also acts as a ground plane due to the metal of the conventional housing being eliminated in the present invention. Some internal electronics of the device require grounding and, therefore, the liner 315 also acts as the ground plane. For example, if a section of the electronic device requires grounding, a metal screw can be used to couple the electronics to the conductive liner 315 by permeating the plastic of the bottom 310 and screwing into the conductive liner 315. Another example is to use a metal standoff that is incorporated onto the conductive liner 315 that extends through the plastic connecting with the printed circuit board or the electronic component itself.

The ports 320, which are the input and output ports of the housing 300, may be formed as part of the conductive liner 315. There are typically four ports 320 on the conductive liner 315 for the input port and three output ports. The ports 320 connect with the coaxial cable that supplies the RF signals, voltage, and current to the electronic circuitry within the housing 300.

Referring to FIG. 4, the section of the ports 320 that is exposed on the outside of the housing 300 contains an aperture for inserting a connector for coupling to a mating connector on the coaxial cable. More specifically, a connector with threads on the inside can be press-fit or glued into the aperture to mate with a corresponding threaded connector and the attached coaxial cable. It will be appreciated that the connector inserted within the aperture can be altered to mate with any other connector, such as a fiber optic connector, so long as the connectors mate and are supported by the electronic circuitry. The coaxial cable has a center conductor that carries the RF signal, voltage, and current. A common shield around the outside of the coaxial cable is typically ground for the coaxial cable. The coaxial cable is connected through known connectors that allow the RF signal, voltage, and current to enter the housing 300. Enclosed electronic circuitry then routes the RF signals to amplifier circuitry, routes a portion of the voltage and current to a power supply that powers the electrical device, and transmits the remaining portion of the voltage and current to the next electrical device, which can be either upstream or downstream. The coaxial cable shield, or ground, is connected with the conductive liner 315 to allow current to pass through the ground plane.

The opposite end of the ports 320 that extends within the housing 300 also contains an aperture 405. A connector, for example, an F connector, is mounted into the aperture that is then coupled with a mating connector on the electronic circuitry. When both connections, i.e., the coaxial cable coupled to the electronic circuitry via the connectors within the ports 320, are made, the voltage, current, and RF signals are provided from the coaxial cable to the electronic circuitry for further processing. It will be appreciated that the connectors inserted within the apertures of the ports 320 also need to be rated to carry 15 A of steady state current and 25 A of surge current for two hours. Additionally, the connectors need to be insulated between the center conductor and the coaxial cable shield to route the voltage, current, and RF signals in a path routed to the amplifier circuitry while the shield remains in contact with the conductive liner 315, or the ground plane.

Referring to FIG. 4 in conjunction with FIG. 3, a substantially square recessed portion 410 in the center of the conductive liner 315 allows for the electronic device, such as an RF amplifier, to have a section that is able to drop down and fit within that portion 410 of the conductive liner 315 while still being shielded from EMI and RFI. It will be appreciated that the square recessed portion 410 is not critical to the design of the conductive liner 315 and can be changed to accommodate any configuration of the enclosed electronic circuitry of the device. Notably, the important feature is to have a conductive liner 315 that is of a one-piece planar design, thereby not allowing the ingress or egress of interference.

Figure 5:
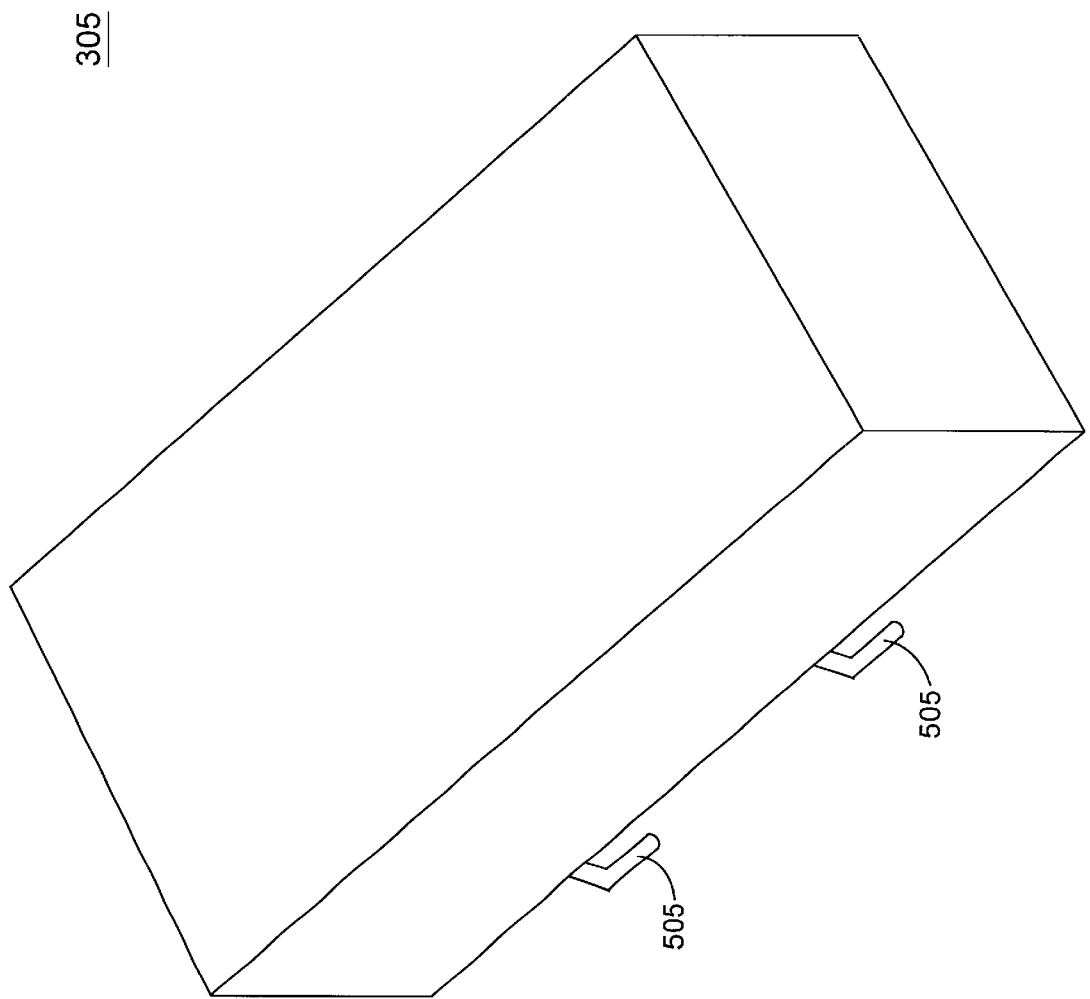
FIG. 5 illustrates a top view of the top portion of the plastic housing of FIG. 3.
Figure 6:
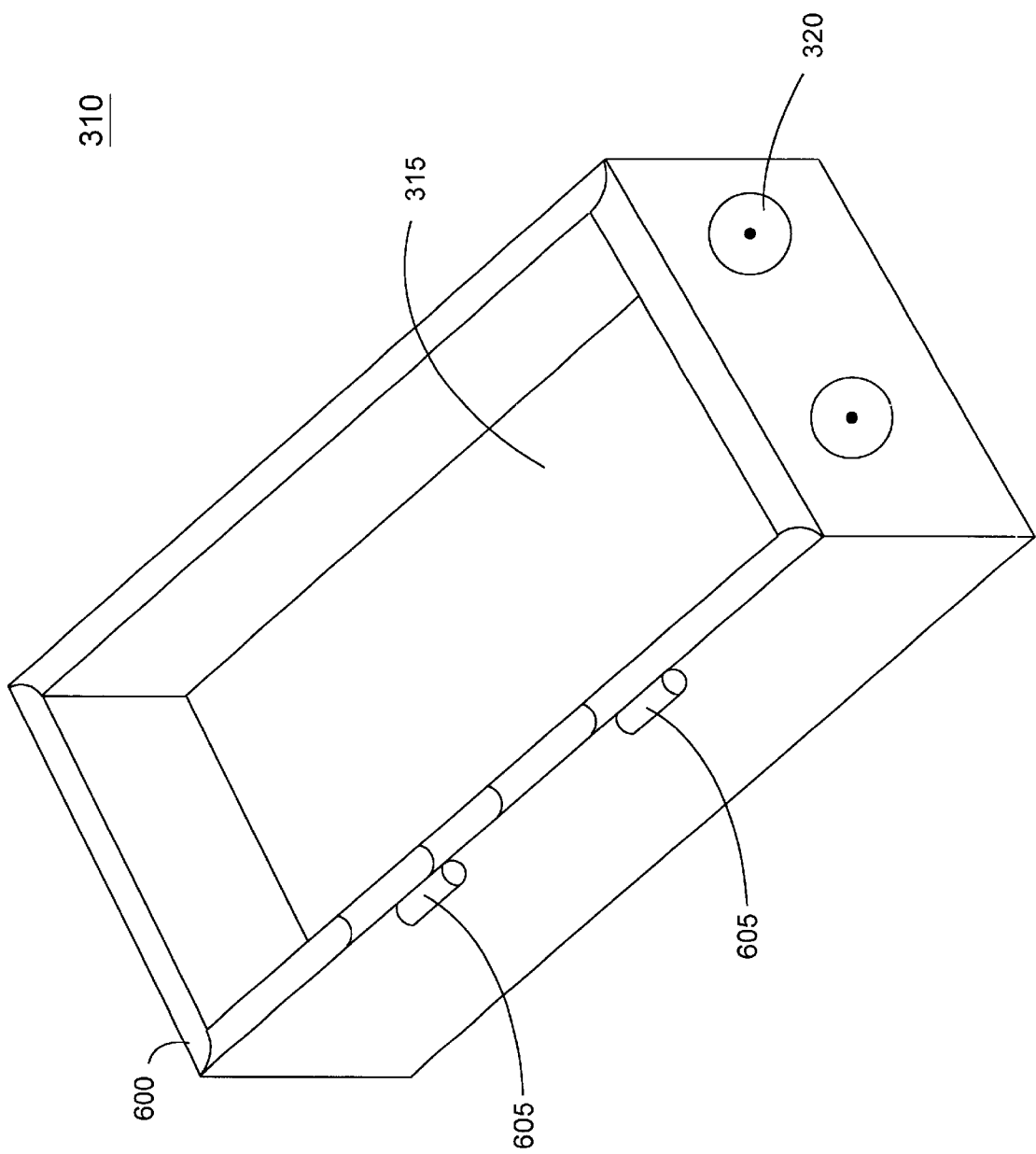
FIG. 6 illustrates a top view of the bottom portion of the plastic housing of FIG. 3.

Referring to FIGS. 5 and 6, a preferred method of manufacturing the plastic housing 300 (FIG. 3) is to mold the lid 305 and the bottom 310 separately. The bottom 310 includes the conductive liner 315 by molding the outer edges and the bottom side of the liner 315 within the plastic and exposing a portion of the ports 320 on both the outside and the inside of the housing 300 as well as the top side of the liner 315. The lid 305 and bottom 310 are then connected with rotating hinges 505, 605. The hinges 505, 605 are also molded along with the lid 305 and the bottom 310. By way of example, the lid 305 (FIG. 5) can have formed shafts 505 each for inserting into an aperture 605 (FIG. 6). Once the shafts 505 have been aligned with the apertures 605 on the bottom 310, the shafts 505 are inserted and slid within the apertures 605. The plastic housing 300 can then be opened and closed very easily.

Referring again to FIG. 3, the plastic housing includes an all-plastic, over-center latch 325. In contrast to the conventional metal housing that requires several bolts to be removed in order to open the housing and to close, the bolts need to be screwed in the housing in a specific order and torque, a latch design with the present invention is a preferred method. In addition to the ease of use, the latch 325 adequately closes the housing 300 to prevent the ingress of noise or the radiation of emissions. Using a latch mechanism, such as an over-center plastic latch, greatly reduces the amount of time required to open and close a housing. It will be appreciated that more than one latch can be used on the housing 300 if the force to close and properly seal the housing 300 is too great. More latches, in comparison to one latch, reduce the necessary force to close and seal the housing 300.

FIG. 6 illustrates a groove 610 that is formed around the lid 305 (not shown) and the bottom 310 along the inside edges, which aids in EMI shielding and weather protection. A one-piece gasket, such as a rounded wire mesh, is inserted into the bottom groove 610 to ensure when the lid 305 is closed and properly latched, the gasket 610 seals against the weather and shields from interferences. More specifically, the plastic housing 300 should meet the radiated emission limits stated in the FCC Part 15 Class A specifications as follows:

| Frequency in mega Hertz (MHz) | Quasi-peak limit @ 10 meters (m) in (dB(uV/m)) | Average limit @ 10 m in (dB(uV/m)) | Peak limit at 10 m in (dB(uV/m)) |
| --- | --- | --- | --- |
| 30–88 | 39.1 | — | — |
| 88–216 | 43.5 | — | — |
| 216–960 | 46.4 | — | — |
| 960–1000 | 49.5 | — | — |
| >1000 | — | 49.5 | 69.5 |

In addition to the emissions specifications above, the housing 300 should also withstand sufficient weather and water sealing. More specifically, when the housing 300 including the gasket in the bottom groove 610 is closed and sealed, there should be no water allowed to enter and no air allowed to escape the housing 300. A typical water-sealing test for the housing 300 is to fully submerge the housing 300 into a water bath and blow ten pounds per square inch (psi) of air into the housing 300 through a hose and connector. After a period of time, if no bubbles rise to the surface emanating from the housing 300, the sealing around the closed housing 300 meets the water sealing specifications.

In summary, the present invention describes a plastic housing 300 with a conductive liner 315 capable of withstanding significant heat generation from the internal electronics and the capability of passing a minimum of 15 A electric current and 25 A of surge current. Advantageously, the housing 300 is made from a lightweight plastic material, thereby significantly reducing the weight of the housing while increasing the corrosion properties due to the plastic replacing all the previously used metal. It will be appreciated that the present invention is a significant leap forward in the improvement of the conventional metal housing.

What is claimed is:

1. A plastic housing for enclosing electronic circuitry, comprising:
   connectors for receiving and transmitting signals and power, the connectors each including a center conductor and a shield;
   a conductive liner connected to each shield within the connectors,
   whereby the conductive liner is capable of passing current essentially through ground and shields the enclosed electronic circuitry from interference,
   a plastic lid; and
   a plastic bottom that includes the conductive liner, wherein the connectors extend through the plastic bottom for accessibility.

2. The plastic housing of claim 1, wherein current passing capability should meet a minimum of 15 amperes of steady state current and a surge current of 25 amperes.

3. The plastic housing of claim 1, wherein the plastic housing is made from a high temperature plastic capable of withstanding a minimum of 60 degrees Celcius.

4. The plastic housing of claim 1, wherein the conductive liner is made of aluminum.

5. The plastic housing of claim 1, further comprising:
   mating hinges located on both of the plastic lid and plastic bottom for rotating the plastic housing open and closed; and
   an over-center plastic latch located on an opposite side of the mating hinges for closing the plastic lid and the plastic bottom, wherein when closed, the plastic housing meets weather and water sealing specifications.

6. The plastic housing of claim 1, further comprising:
   an EMI shielded gasket for inserting within a groove in the plastic bottom.

7. The plastic housing of claim 1, wherein the electronic circuitry is an RF amplifier that amplifies RF signals, uses a portion of the power, and transmits a remaining portion of the power.

8. The plastic housing of claim 7, wherein the RF amplifier is used within a broadband cable television system by coupling coaxial cables to each of the connectors.

9. In a system for transmitting and receiving signals and power along a coaxial cable, a device for processing the signals, comprising:
   a non-conductive plastic housing, the housing including:
      at least one input port, the input port including a connector having a shield and a center conductor for carrying the signals;

at least one output port, the output port including a connector having a shield and a center conductor for carrying the signals; and a conductive liner, the liner being electrically connected to the shield of input port connector and the shield of the output port connector;

electronic circuitry for processing the signals, the electronic circuitry including:

processing circuitry for processing the signals received from the center conductor of the input port connector and for providing power to the processing circuitry;

bypass circuitry for providing the power received from the center conductor of the input port connector to the center conductor of the output port connector; and output circuitry for providing the processed signal to the center conductor of the output port connector.

10. The device of claim 9, wherein the device is an RF amplifier that amplifies the signals.

11. The device of claim 9, wherein the power includes voltage and current, and wherein the device should meet a minimum current carrying specification of 15 amperes of steady state current and a surge current of 25 amperes.

12. The device of claim 9, wherein the housing is made from a high temperature plastic capable of withstanding a minimum of 60 degrees Celcius.

13. The device of claim 9, wherein the conductive liner is made of aluminum.

14. The device of claim 9, wherein the housing further comprises:

a lid; and a bottom that includes the conductive liner, wherein the input port and the output port extend through the bottom for accessibility.

15. The device of claim 14, wherein the housing further comprises:

mating hinges located on both of the lid and the bottom for rotating the housing open and closed; and an over-center plastic latch located on the opposite side of the mating hinges for closing the lid and the bottom, wherein when closed and latched, the housing meets weather and water sealing specifications.

16. The device of claim 14, wherein the housing further comprises:

an EMI shielded gasket for inserting within a groove in the bottom.

17. The device of claim 10, wherein the system is a cable television system.

18. The device of claim 17, wherein the RF amplifier is used within the cable television system by coupling the coaxial cable to each of the input port and the output port.

* * * * *

UNITED STATES PATENT AND TRADEMARK OFFICE
CERTIFICATE OF CORRECTION

PATENT NO.    : 6,420,963 B1
DATED         : July 16, 2002
INVENTOR(S)   : Rossetti et al.

It is certified that error appears in the above-identified patent and that said Letters Patent is hereby corrected as shown below:

<u>Column 3,</u>
Line 10, delete "80" and insert therefore -- -80 --

Signed and Sealed this

Nineteenth Day of November, 2002

Attest:

Attesting Officer

JAMES E. ROGAN
Director of the United States Patent and Trademark Office